(12) United States Patent
Lee et al.

(10) Patent No.: US 10,979,680 B2
(45) Date of Patent: Apr. 13, 2021

(54) IMAGE SENSORS AND ELECTRONIC DEVICES

(71) Applicant: Samsung Electronics Co., Ltd., Suwon-si (KR)

(72) Inventors: Gae Hwang Lee, Seongnam-si (KR); Kwang Hee Lee, Hwaseong-si (KR); Kyung Bae Park, Hwaseong-si (KR); Sung Young Yun, Suwon-si (KR); Dong-Seok Leem, Hwaseong-si (KR); Yong Wan Jin, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 137 days.

(21) Appl. No.: 16/182,037

(22) Filed: Nov. 6, 2018

(65) Prior Publication Data

US 2019/0349555 A1   Nov. 14, 2019

(30) Foreign Application Priority Data

May 9, 2018   (KR) ........................ 10-2018-0053160

(51) Int. Cl.
*H04N 9/04* (2006.01)
*H04N 5/32* (2006.01)
*H01L 27/146* (2006.01)

(52) U.S. Cl.
CPC ... *H04N 9/04563* (2018.08); *H01L 27/14621* (2013.01); *H01L 27/14627* (2013.01); *H01L 27/14629* (2013.01); *H04N 5/32* (2013.01)

(58) Field of Classification Search
CPC ...... H04N 9/04563; H04N 5/32; H04N 5/379; H01L 27/14621; H01L 27/14629;
(Continued)

(56) References Cited

U.S. PATENT DOCUMENTS 5,251,069 A * 10/1993 Iizuka ................... G02B 15/14
359/717
5,400,072 A * 3/1995 Izumi ....................... G02B 9/12
348/335

(Continued)

FOREIGN PATENT DOCUMENTS

JP    2009289768 A    12/2009
JP     6153689 B1      6/2017
(Continued)

*Primary Examiner* — Philip P. Dang
(74) *Attorney, Agent, or Firm* — Harness, Dickey & Pierce, P.L.C.

(57) ABSTRACT

An image sensor may include a photoelectric device configured to selectively absorb light associated with a first color of three primary colors, a semiconductor substrate stacked with the photoelectric device and including first and second photo-sensing devices configured to sense light associated with second and third colors of the three primary colors, respectively, a first color filter corresponding to the first photo-sensing device and configured to selectively transmit light of the first wavelength spectrum, a second color filter corresponding to the second photo-sensing device and configured to selectively transmit light associated with a mixed color of the first color and the third color, and a first insulating layer between the photoelectric device and the semiconductor substrate and corresponding to the second photo-sensing device, and configured to selectively reflect light of a part of visible light.

27 Claims, 11 Drawing Sheets

(58) Field of Classification Search
CPC ........... H01L 27/14627; H01L 27/1462; H01L 27/14645; H01L 27/14667
See application file for complete search history.

(56) References Cited

U.S. PATENT DOCUMENTS

| | | | | |
|---|---|---|---|---|
| 5,801,373 | A * | 9/1998 | Oozu | H04N 5/3692 |
| | | | | 250/208.1 |
| 6,590,239 | B2 * | 7/2003 | Hsiung | H01L 27/14627 |
| | | | | 257/214 |
| 7,030,918 | B1 * | 4/2006 | Nakashiba | H01L 27/14621 |
| | | | | 250/208.1 |
| 7,288,429 | B2 * | 10/2007 | Yaung | H01L 27/14636 |
| | | | | 257/292 |
| 7,400,023 | B2 * | 7/2008 | Watanabe | H01L 27/14692 |
| | | | | 257/440 |
| 7,537,951 | B2 * | 5/2009 | Gambino | H01L 27/14603 |
| | | | | 438/48 |
| 7,579,665 | B2 * | 8/2009 | Yokoyama | H01L 27/14621 |
| | | | | 257/440 |
| 7,667,750 | B2 * | 2/2010 | Goto | H04N 9/045 |
| | | | | 348/273 |
| 7,759,679 | B2 | 7/2010 | Inaba et al. | |
| 7,760,254 | B2 * | 7/2010 | Suzuki | H01L 27/14647 |
| | | | | 348/272 |
| 7,888,763 | B2 * | 2/2011 | Qian | H01L 27/14632 |
| | | | | 257/460 |
| 7,968,923 | B2 | 6/2011 | Nagaraja et al. | |
| 8,053,821 | B2 * | 11/2011 | Moon | H01L 27/14625 |
| | | | | 257/292 |
| 8,223,234 | B2 * | 7/2012 | Inuiya | H04N 9/045 |
| | | | | 348/294 |
| 8,378,400 | B2 * | 2/2013 | Masuoka | H01L 31/035281 |
| | | | | 257/292 |
| 8,405,180 | B2 * | 3/2013 | Akiyama | H01L 27/14643 |
| | | | | 257/432 |
| 8,422,136 | B2 * | 4/2013 | Hasegawa | G01J 1/04 |
| | | | | 359/619 |
| 8,466,452 | B2 * | 6/2013 | Kim | B82Y 10/00 |
| | | | | 257/40 |
| 8,648,436 | B2 * | 2/2014 | Toda | H01L 27/14687 |
| | | | | 257/440 |
| 8,773,558 | B2 * | 7/2014 | Kato | H01L 27/14627 |
| | | | | 348/294 |
| 9,054,243 | B2 * | 6/2015 | Sawayama | H01L 27/14629 |
| 9,293,493 | B2 * | 3/2016 | Kobayashi | H01L 27/14623 |
| 9,419,035 | B2 | 8/2016 | Wu et al. | |
| 9,455,302 | B2 * | 9/2016 | Lee | H01L 27/307 |
| 9,515,126 | B2 * | 12/2016 | Lee | H01L 27/14645 |
| 9,614,010 | B2 * | 4/2017 | Joei | H01L 27/307 |
| 9,620,657 | B2 * | 4/2017 | Lee | H01L 27/14625 |
| 9,666,628 | B2 * | 5/2017 | Hayashi | H01L 31/0216 |
| 9,748,295 | B2 * | 8/2017 | Lee | H01L 27/14645 |
| 9,774,774 | B2 * | 9/2017 | Lee | H04N 5/23245 |
| 9,780,130 | B2 | 10/2017 | Suh et al. | |
| 9,853,223 | B2 * | 12/2017 | Wada | H01L 51/0052 |
| 9,989,677 | B2 * | 6/2018 | Shalaev | G02B 1/002 |
| 10,008,544 | B2 * | 6/2018 | Park | H01L 27/307 |
| 10,186,544 | B2 * | 1/2019 | Lee | H01L 27/14636 |
| 10,325,947 | B2 * | 6/2019 | Velichko | H04N 5/3745 |
| 10,347,841 | B2 * | 7/2019 | Choi | H01L 51/0068 |
| 10,348,990 | B2 * | 7/2019 | Gotoh | H01L 27/14 |
| 10,396,113 | B2 * | 8/2019 | Yamaguchi | H01L 27/14636 |
| 10,566,557 | B2 * | 2/2020 | Yamaguchi | H01L 27/14636 |
| 2007/0058055 | A1 | 3/2007 | Yamaguchi et al. | |
| 2008/0035835 | A1 * | 2/2008 | Komatsu | B82Y 10/00 |
| | | | | 250/208.1 |
| 2010/0327384 | A1 | 12/2010 | Tomoda | |
| 2016/0247860 | A1 * | 8/2016 | Ito | H01L 51/4253 |
| 2017/0053969 | A1 | 2/2017 | Roh et al. | |
| 2017/0365634 | A1 | 12/2017 | Aoki et al. | |
| 2018/0067242 | A1 * | 3/2018 | Lai | G02B 13/0045 |
| 2018/0277604 | A1 * | 9/2018 | Joei | H01L 27/307 |

FOREIGN PATENT DOCUMENTS

| | | |
|---|---|---|
| KR | 100680386 B1 | 2/2007 |
| KR | 100731093 B1 | 6/2007 |
| KR | 100748325 B1 | 8/2007 |
| KR | 20110079333 A | 7/2011 |
| KR | 20150145934 A | 12/2015 |
| KR | 2017-0022177 A | 3/2017 |

\* cited by examiner

IMAGE SENSORS AND ELECTRONIC DEVICES

CROSS-REFERENCE TO RELATED APPLICATION

This application claims priority to and the benefit of, under 35 U.S.C. § 119, Korean Patent Application No. 10-2018-0053160 filed in the Korean Intellectual Property Office on May 9, 2018, the entire contents of which are incorporated herein by reference.

BACKGROUND

1. Field

Image sensors and electronic devices are disclosed.

2. Description of the Related Art

Imaging devices are used in digital cameras and camcorders, etc., to capture images and to store said images as electrical signals. An imaging device may include an image sensor that may separate incident light into separate components according to wavelength and convert each separate component to a separate electrical signal.

SUMMARY

Some example embodiments are directed to providing image sensors with reduced size, including image sensors having a stacked structure.

Some example embodiments provide an image sensor having a stacking structure capable of improving sensitivity and color separation characteristics.

Some example embodiments provide an electronic device including the image sensor.

According to some example embodiments, an image sensor may include a photoelectric device configured to selectively absorb light associated with a first wavelength spectrum, the first wavelength spectrum associated with a first color of three primary colors. The image sensor may include a semiconductor substrate stacked with the photoelectric device, the semiconductor substrate including a first photo-sensing device and a second photo-sensing device. The first photo-sensing device may be configured to sense light associated with a second wavelength spectrum, the second wavelength spectrum associated with a second color of the three primary colors. The second photo-sensing device may be configured to sense light associated with a third wavelength spectrum, the third wavelength spectrum associated with a third color of the three primary colors. The image sensor may include a first color filter corresponding to the first photo-sensing device. The first color filter may be configured to selectively transmit light associated with the second wavelength spectrum. The image sensor may include a second color filter corresponding to the second photo-sensing device. The second color filter may be configured to selectively transmit light associated with a mixed wavelength spectrum. The mixed wavelength spectrum may be associated with a mixed color of the first color and the third color. The image sensor may include a first insulating layer between the photoelectric device and the semiconductor substrate. The first insulating layer may correspond to the second photo-sensing device. The first insulating layer may be configured to selectively reflect light of a limited portion of a wavelength spectrum of visible light, the wavelength spectrum of visible light including the first, second, and third wavelength spectra.

The first insulating layer is configured to selectively reflect light associated with the first wavelength spectrum or the second wavelength spectrum.

The first insulating layer may include a first layer and a second layer. The first layer may be associated with a first refractive index, the second layer may be associated with a second refractive index, and the second refractive index may be different from the first refractive index.

A difference between the first refractive index and the second refractive index may be equal to or greater than about 0.2.

The first refractive index may range from about 1.2 to about 1.8, and the second refractive index may range from about 2.0 to about 3.0.

The image sensor may further include a second insulating layer between the photoelectric device and the semiconductor substrate. The second insulating layer may correspond to the first photo-sensing device. The second insulating layer may be different from the first insulating layer.

A refractive index of the first insulating layer may be different from a refractive index of the second insulating layer.

A thickness of the first insulating layer may be different from a thickness of the second insulating layer.

The thickness of the first insulating layer may be greater than the thickness of the second insulating layer.

The first insulating layer may include a first layer and a second layer. The first layer may be associated with a first refractive index. The second layer may be associated with a second refractive index. The second refractive index may be different from the first refractive index. The second insulating layer may include a common material as the first layer or the second layer.

The image sensor may include a third insulating layer on the first insulating layer and the second insulating layer, wherein a refractive index of the third insulating layer is different from a refractive index of the first insulating layer.

The third insulating layer may include silicon oxide.

The first color may be green, the first color filter may be a blue filter or a red filter, and the second color filter may be a yellow filter or a cyan filter.

The first color may be red, the first color filter may be a blue filter or a green filter, and the second color filter may be a yellow filter or a magenta filter.

The first color may be blue, the first color filter may be a green filter or a red filter, and the second color filter may be a magenta filter or a cyan filter.

Each color filter of the first color filter and the second color filter may be between the photoelectric device and the semiconductor substrate.

The image sensor may include a focusing lens on the photoelectric device, wherein the focusing lens includes a first focusing lens on the first photo-sensing device, and a second focusing lens on the second photo-sensing device, and wherein a thickness of the first focusing lens is different from a thickness of the second focusing lens.

The second wavelength spectrum may be a longer wavelength region than the third wavelength spectrum, and the thickness of the first focusing lens may be greater than the thickness of the second focusing lens.

The third wavelength spectrum may be a longer wavelength region than the second wavelength spectrum, and the thickness of the second focusing lens may be greater than the thickness of the first focusing lens.

An electronic device may include the image sensor of claim 1.

According to some example embodiments, an image sensor may include a photoelectric device configured to selectively absorb light associated with a first wavelength spectrum. The image sensor may include a semiconductor substrate stacked with the photoelectric device. The semiconductor substrate may include a first photo-sensing device configured to sense light associated with a second wavelength spectrum. The image sensor may include a first insulating layer between the photoelectric device and the semiconductor substrate. The first insulating layer may correspond to the first photo-sensing device. The first insulating layer may be configured to selectively reflect light of a limited portion of a wavelength spectrum of visible light. The wavelength spectrum of visible light may include the first and second wavelength spectra.

The first insulating layer may be configured to selectively reflect light associated with the first wavelength spectrum.

The first insulating layer may include a first layer and a second layer, the first layer associated with a first refractive index, the second layer associated with a second refractive index, the second refractive index different from the first refractive index.

A difference between the first refractive index and the second refractive index may be equal to or greater than about 0.2.

The image sensor may further include a first color filter corresponding to the first photo-sensing device, the first color filter configured to selectively transmit at least light associated with the second wavelength spectrum.

The first color filter may be between the photoelectric device and the semiconductor substrate.

The photoelectric device may be between the first color filter and the semiconductor substrate.

The semiconductor substrate may include a second photo-sensing device configured to sense light associated with a third wavelength spectrum.

The photoelectric device may include a first photoelectric device corresponding to the first photo-sensing device, and a second photoelectric device corresponding to the second photo-sensing device, the first and second photoelectric devices configured to selectively absorb light associated with different wavelength spectra.

The first and second photo-sensing devices may be stacked orthogonally in the semiconductor substrate such that the first photo-sensing device is proximate to an upper surface of the semiconductor substrate in relation to the second photo-sensing device.

The first wavelength spectrum may be an infra-red wavelength spectrum.

DETAILED DESCRIPTION

Figure 1:
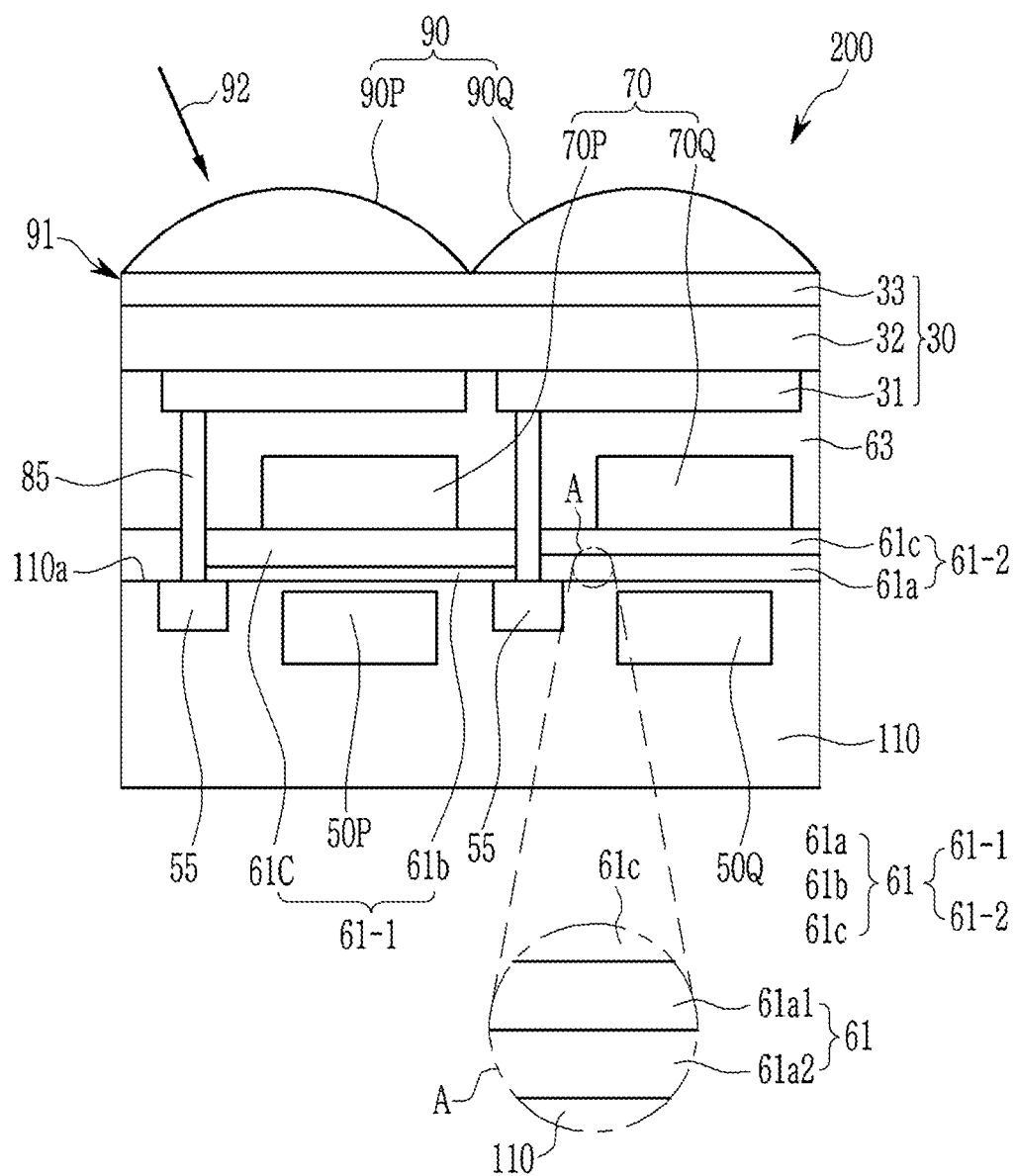
FIG. 1 is a cross-sectional view of an image sensor according to some example embodiments.

Hereinafter, example embodiments of the present inventive concepts will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

In the drawings, parts having no relationship with the description are omitted for clarity of the embodiments, and the same or similar constituent elements are indicated by the same reference numeral throughout the specification.

Hereinafter, the terms 'lower' and 'upper' are used for better understanding and ease of description, but do not limit the position relationship.

In the following descriptions, it is described that the light-receiving side is on the image sensor, but this is for the better understanding and ease of description, and does not limit the position relationship.

Hereinafter, an image sensor according to some example embodiments is described.

FIG. 1 is a cross-sectional view of an image sensor according to some example embodiments.

Referring to FIG. 1, an image sensor 200 according to some example embodiments is a stacked image sensor where a photoelectric device 30 and a semiconductor substrate 110 are stacked. As referred to herein, an element that is "stacked" on another element may be on the other element such that both "stacked" elements extend in parallel or substantially in parallel with each other (e.g., in parallel within manufacturing tolerances and/or material tolerances). As shown in FIG. 1, at least the photoelectric device 30 and the semiconductor substrate 110 are stacked with regard to each other.

The photoelectric device 30 may be disposed at a light-incidence side 91 (i.e., a side of the image sensor 200 that is proximate to a source of incident light 92 in relation to the semiconductor substrate 110, for example as shown in FIG. 1) and may selectively sense light of ("associated with") a wavelength spectrum of a first color that is a part of a visible ray region. (e.g., a first wavelength spectrum) The light of the wavelength spectrum of the first color (the first wavelength spectrum) may be one of light of three primary colors (i.e., a wavelength spectrum associated with one of three different wavelength spectra associated with three separate primary colors).

As shown in FIG. 1, the photoelectric device 30 may be between the semiconductor substrate 110 and the light-incidence side 91 of the image sensor 200. In some example embodiments, the semiconductor substrate 110 may be between the light-incidence side 91 and the photoelectric device 30, such that the photo-sensing devices 50P, 50Q are proximate to the light-incidence side 91 in relation to the photoelectric device 30.

The photoelectric device 30 includes a lower electrode 31 and an upper electrode 33 facing each other and an active layer 32 between the lower electrode 31 and the upper electrode 33.

One of the lower electrode 31 and the upper electrode 33 is an anode and the other is a cathode. Both of the lower electrode 31 and the upper electrode 33 may be a light-transmitting electrode, and the light-transmitting electrode may be made of, for example, a transparent conductor such as indium tin oxide (ITO) or indium zinc oxide (IZO), or may be a metal thin layer having a thin thickness of several nanometers or several tens of nanometers or a metal thin layer having a thin thickness of several nanometers to several tens of nanometers doped with a metal oxide.

The active layer 32 may selectively absorb light of a wavelength spectrum of a first color (e.g., light associated with a first wavelength spectrum). The active layer 32 may selectively absorb light of a wavelength spectrum of a first color and may transmit light except the wavelength spectrum of the first color.

The light of the wavelength spectrum of the first color ("the light associated with a first wavelength spectrum") may be red light having a maximum absorption wavelength ($\lambda_{max}$) in greater than about 600 nm and less than or equal to about 700 nm. The light of the wavelength spectrum of the first color may be for example red light having a maximum absorption wavelength ($\lambda_{max}$) in about 630 nm to about 680 nm.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

The light of the wavelength spectrum of the first color may be blue light having a maximum absorption wavelength ($\lambda_{max}$) in greater than or equal to about 400 nm and less than about 500 nm. The light of the wavelength spectrum of the first color may be for example blue light having a maximum absorption wavelength ($\lambda_{max}$) in about 420 nm to about 480 nm.

The light of the wavelength spectrum of the first color may be green light having a maximum absorption wavelength ($\lambda_{max}$) in about 500 nm to about 600 nm. The light of the wavelength spectrum of the first color may be for example green light having a maximum absorption wavelength ($\lambda_{max}$) in about 520 nm to about 580 nm.

The active layer 32 may include a p-type semiconductor and an n-type semiconductor and the p-type semiconductor and the n-type semiconductor may form a pn junction. The active layer 32 may selectively absorb the light of the wavelength spectrum of the first color to generate excitons, then the generated excitons may be separated into holes and electrons, and then separated holes transfer to an anode that is one of the lower electrode 31 and the upper electrode 33 and separated electrons transfer to a cathode that is one of the lower electrode 31 and the upper electrode 33 to provide a photoelectric effect. The separated electrons and/or holes may be collected in the charge storage 55.

At least one of the p-type semiconductor and the n-type semiconductor may selectively absorb the light of the wavelength spectrum of the first color. The p-type semiconductor and the n-type semiconductor may independently include an organic material, an inorganic material, or an organic/inorganic material. At least one of the p-type semiconductor and the n-type semiconductor may include an organic material.

The active layer 32 may be a single layer or a multilayer. The active layer 32 may be for example an intrinsic layer (I layer), a p-type layer/I layer, an I layer/n-type layer, a p-type layer/I layer/n-type layer, a p-type layer/n-type layer, and the like.

The intrinsic layer (I layer) may include the p-type semiconductor and the n-type semiconductor in a volume ratio of about 1:100 to about 100:1. The p-type semiconductor and the n-type semiconductor may be mixed in a volume ratio of about 1:50 to about 50:1, about 1:10 to about 10:1, or about 1:1. When the p-type and n-type semiconductors have a composition ratio within the range, an exciton may be effectively produced and a pn junction may be effectively formed.

The p-type layer may include the p-type semiconductor, and the n-type layer may include the n-type semiconductor.

The active layer 32 may have a thickness of about 1 nm to about 500 nm. Within the range, the active layer 32 may have for example a thickness of about 5 nm to about 300 nm or about 5 nm to about 200 nm. Within the thickness ranges, the active layer 32 may effectively absorb the light of the wavelength spectrum of the first color, effectively separate holes from electrons, and transport them, thereby effectively improving photoelectric conversion efficiency.

The active layer 32 may be formed at the whole surface ("the entire surface") of the image sensor 200. Thereby, as the light of the wavelength spectrum of the first color may be selectively absorbed at the whole surface of the image sensor, the light area may be increased to provide high light-absorptive efficiency.

The semiconductor substrate 110 may be a silicon substrate, and is integrated with (e.g., includes) a first photo-sensing device 50P, a second photo-sensing device 50Q, a charge storage 55, and a transmission transistor (not shown). Each pixel may include the first photo-sensing device 50P or the second photo-sensing device 50Q. As shown in FIG. 1, the semiconductor substrate 110 may be "stacked" with the photoelectric device 30, such that the photoelectric device 30 is on the semiconductor substrate 110 in a direction that is orthogonal ("perpendicular") or substantially orthogonal (e.g., orthogonal within manufacturing tolerances and/or material tolerances) to an upper surface 110a of the semiconductor substrate 110.

As described herein, an element that is "on" another element may be above or beneath the other element. Additionally, an element that is on another element may be "directly" on the other element (e.g., photoelectric device 30 may be directly on the upper insulating layer 63) and/or may be "indirectly" on the other element such that one or more interposing elements and/or spaces isolate the element from direct contact with the other element (e.g., the photoelectric device 30 may be indirectly on semiconductor substrate 110 such that at least the lower insulating layer 61 interposes between the photoelectric device 30 and the semiconductor substrate 110).

The first photo-sensing device 50P and the second photo-sensing device 50Q may repetitively be arranged along with a row and a column. The first photo-sensing device 50P and the second photo-sensing device 50Q may be photodiodes. The first photo-sensing device 50P and the second photo-sensing device 50Q may each sense light, and sensed information may be transferred by the transmission transistor. The charge storage 55 is electrically connected to the photoelectric device 30 and information of the charge storage 55 may be transferred by the transmission transistor.

A metal wire (not shown) and a pad (not shown) are formed under or on the first photo-sensing device 50P and the second photo-sensing device 50Q. In order to decrease signal delay, the metal wire and pad may be made of a metal having low resistivity, for example, aluminum (Al), copper (Cu), silver (Ag), and alloys thereof, but are not limited thereto.

A color filter layer 70 is formed on the semiconductor substrate 110. The color filter layer 70 may include a first color filter 70P and a second color filter 70Q that selectively transmit light of a predetermined wavelength spectrum.

A plurality of the first color filters 70P and a plurality of the second color filters 70Q may form a unit color filter array, and a plurality of unit color filter arrays may be repetitively arranged along with a row and a column. The unit color filter array may for example various matrix arrangements of 2×2, 3×3, 4×4, and the like, but is not limited thereto.

The first color filter 70P may be disposed corresponding to the first photo-sensing device 50P, and for example the first color filter 70P and the first photo-sensing device 50P may overlap in a vertical direction (e.g., a direction extending orthogonal or substantially orthogonal to the upper surface 110a of the semiconductor substrate 110) such that the first color filter 70P "corresponds" to the first photo-sensing device 50P. The second color filter 70Q may be disposed corresponding to the second photo-sensing device 50Q, and for example the second color filter 70Q and the second photo-sensing device 50Q may overlap in a vertical direction such that the second color filter 70Q "corresponds" to the second photo-sensing device 50Q.

In the drawing, each color filter of the first color filter 70P and the second color filter 70Q is between the photoelectric device 30 and the semiconductor substrate 110, but the first color filter 70P and the second color filter 70Q may be disposed on the photoelectric device 30 and the semiconductor substrate 110, such that the color filter layer 70 is distal from the semiconductor substrate 110 in relation to the photoelectric device 30.

The first color filter 70P may selectively transmit light of one wavelength spectrum or a plurality of wavelength spectra of plural colors among three primary colors, and for example may be configured to selectively transmit light in a wavelength spectrum including the second color that is different from the first color (e.g., light associated with a second wavelength spectrum that is associated with a second color of three primary colors, which may be different from the first wavelength spectrum of light selectively absorbed by the photoelectric device 30). The first color filter 70P may be configured to selectively transmit light in a wavelength spectrum of the second color ("a second wavelength spectrum"). The first color filter 70P may be configured to transmit light in wavelength spectra of the first color and the second color (e.g., the first wavelength spectrum and the second wavelength spectrum). The first color filter 70P may be configured to transmit light in wavelength spectra of the second color and the third color that is different from the first color and the second color (e.g., light associated with a third wavelength spectrum that is associated with a third color). The first color filter 70P may be configured to selectively transmit light in wavelength spectra of the first color, the second color, and the third color.

The first color filter 70P may be one of a red filter configured to selectively transmit light of a red wavelength spectrum, a green filter configured to selectively transmit light of a green wavelength spectrum, and a blue filter configured to selectively transmit light of a blue wavelength spectrum.

The first color filter 70P may be one of a cyan filter configured to selectively transmit light of blue and green wavelength spectra, a magenta filter configured to selectively transmit light of blue and red wavelength spectra, and a yellow filter configured to selectively transmit light of red and green wavelength spectra.

The second color filter 70Q may be configured to selectively transmit light of wavelength spectra of plural colors of three primary colors (e.g., a mixed wavelength spectrum), for example, may be configured to selectively transmit light of a mixed wavelength spectrum that is associated with a mixed color of ("including") the first color selectively sensed in a photoelectric device 30 and light of a wavelength spectrum of a third color ("third wavelength spectrum associated with a third color") that is different from the first color and the second color. That is, the second color filter 70Q may be configured to selectively transmit mixed light that excludes the color of light selectively transmitted by the first color filter 70P.

The second color filter 70Q may be one of a cyan filter configured to selectively transmit light of blue and green wavelength spectra, a magenta filter configured to selectively transmit light of blue and red wavelength spectra, and a yellow filter configured to selectively transmit light of red and green wavelength spectra.

The first color filter 70P may be one of a red filter, a green filter, and a blue filter and the second color filter 70Q may be one of a cyan filter, a magenta filter, and a yellow filter.

The first color filter 70P and the second color filter 70Q may independently be one of a cyan filter, a magenta filter, and a yellow filter.

The first photo-sensing device 50P may be configured to sense light that is transmitted by the first color filter 70P and the second photo-sensing device 50Q may be configured to sense light that is transmitted by the second color filter 70Q. The first photo-sensing device 50P may be configured to sense light of a wavelength spectrum of a second color ("light associated with a second wavelength spectrum that is associated with a second color of three primary colors that is different from the first color of light selectively absorbed by the photoelectric device 30") that is transmitted by the photoelectric device 30 and the first color filter 70P and the second photo-sensing device 50Q may be configured to sense light of a wavelength spectrum of a third color ("light associated with a third wavelength spectrum that is associated with a third color of three primary colors that is different from the first color of light selectively absorbed by the photoelectric device 30 and the second color of light") that is transmitted by the photoelectric device 30 and the second color filter 70Q. Accordingly, the photoelectric device 30, the first photo-sensing device 50P, and the second photo-sensing device 50Q may be configured to sense light of wavelength spectra of different colors, respectively. These three different colors sensed by the photoelectric device 30, the first photo-sensing device 50P, and the second photo-sensing device 50Q may be different primary colors of three primary colors (e.g., red, green, and blue). The first photo-sensing device 50P may be configured to selectively sense light associated with the second wavelength spectrum independently of (e.g., in the absence of) the first color filter 70P, and the second photo-sensing device 50Q may be configured to selectively sense light associated with the third wavelength spectrum independently of (e.g., in the absence of) the second color filter 70Q. Accordingly, in some example embodiments, the color filter layer 70 may be omitted from any of the example embodiments of image sensors described herein and different photo-sensing devices in some example embodiments of an image sensor may be configured to sense light associated with different particular wavelength spectra independently of (e.g., in the absence of) a color filter layer 70.

A lower insulating layer 61 and an upper insulating layer 63 may be formed between the semiconductor substrate 110 and the photoelectric device 30.

The lower insulating layer 61 may be disposed near ("proximate") to the semiconductor substrate 110 and may be configured to control the transmission of light to the semiconductor substrate 110 and the reflect of light from the semiconductor substrate 110. Specifically, the lower insulating layer 61 may selectively reflect light of one or more wavelength spectra except light of the one or more wavelength spectra which may be sensed by the first photo-sensing device 50P or the second photo-sensing device 50Q in the semiconductor substrate 110 among light passed through the photoelectric device 30 and the color filter layer 70. Restated, the lower insulating layer 61 may selectively transmit light associated with a "main color" sensed by the first photo-sensing device 50P and/or light associated with a "main color" sensed by the second photo-sensing device 50Q and may reflect all other wavelength spectra of visible light from entering to the semiconductor substrate 110.

In some example embodiments, since the wavelength spectra (e.g., "main colors") sensed by the first photo-sensing device 50P or the second photo-sensing device 50Q are different from each other, the lower insulating layer 61 disposed corresponding to (e.g., vertically overlapping in a vertical direction) the first photo-sensing device 50P may be configured to selectively reflect light of any wavelength spectrum of visible light except light of the wavelength spectrum of the second color sensed by the first photo-sensing device 50P (e.g., light associated with the second wavelength spectrum) and the lower insulating layer 61 disposed corresponding to (e.g., vertically overlapping in a vertical direction) the second photo-sensing device 50Q may be configured to selectively reflect light of any wavelength spectrum of visible light except light of the wavelength spectrum of the third color sensed by the second photo-sensing device 50Q (e.g., light associated with the third wavelength spectrum). That is, in a case that the lower insulating layer 61 including a first insulating layer 61a disposed corresponding to the second photo-sensing device 50Q and a second insulating layer 61b disposed corresponding to the first photo-sensing device 50P, the first insulating layer 61a and the second insulating layer 61b may be different from each other. In some example embodiments, the second insulating layer 61b may be omitted from the lower insulating layer 61.

The first insulating layer 61a may be formed of ("may at least partially comprise") a different material from the second insulating layer 61b. The first insulating layer 61a may have a different refractive index from the second insulating layer 61b. Restated, the first insulating layer 61a may be associated with a first refractive index and the second insulating layer 61b may be associated with a second refractive index that is different from the first refractive index.

The thickness of the first insulating layer 61a may be different from the thickness of the second insulating layer 61b. For example, as shown in at least FIG. 1, the thickness of the first insulating layer 61a may be greater than the thickness of the second insulating layer 61b.

Each layer of the first insulating layer 61a and the second insulating layer 61b may independently include monolayer or multilayer, and the first insulating layer 61a may have a different number of layers from the second insulating layer 61b.

The first insulating layer 61a may selectively reflect light of a limited portion of the wavelength spectrum of visible light, for example, it may be configured to selectively reflect light of wavelength spectra of the first color or the second color except the wavelength spectrum of the third color sensed by the second photo-sensing device 50Q. Restated, the first insulating layer 61a may selectively reflect light of the first wavelength spectrum and/or the second wavelength spectrum and may selectively transmit light of the third wavelength spectrum.

As shown in the region "A" of the image sensor 200 as shown in FIG. 1, the first insulating layer 61a may include a first layer 61a1 and a second layer 61a2 having different refractive indexes. Restated, the first layer 61a1 may be associated with a first refractive index and the second layer 61a2 may be associated with a second refractive index that is different from the first refractive index. The refractive index difference between the first layer and the second layer (e.g., the difference between the first refractive index and the second refractive index) may be, for example, greater than or equal to about 0.1, greater than or equal to about 0.2, greater than or equal to about 0.3, greater than or equal to about 0.4, or greater than or equal to about 0.5.

The first layer 61a1 may be a layer having a low refractive index, and the second layer 61a2 may be a layer having a high refractive index layer. Herein, the low refractive index and the high refractive index only mean to be relative, but do not mean absolute refractive indexes. For example, the first layer 61a1 may have a first refractive index of about 1.2 to about 1.8, and the second layer 61a2 may have a second refractive index of about 2.0 to about 3.0. Within the range, the first layer 61a1 may have a first reflective index of, for example, about 1.2 to about 1.7, and the second layer 61a2 may have a second refractive index of about 2.1 to about 2.8. For example, the first layer 61a1 may include an oxide or a nitride including silicon, aluminum, or a combination thereof, and the second layer 61a2 may be an oxide or a nitride including titanium, barium, zinc, zirconium, or a combination thereof, but is not limited thereto. The first layer 61a1 may be silicon nitride, silicon oxide, aluminum oxide, or a combination thereof and the second layer 61a2 may be titanium oxide, barium oxide, zinc oxide, zinc sulfide, or zirconium oxide, but is not limited thereto.

The first layer 61a1 and the second layer 61a2 may each include a plurality of layers alternatively deposited.

The thicknesses of the first layer 61a1 and the second layer 61a2 may be determined depending upon the a refractive index of each layer and a reflecting wavelength spectrum, for example, the thickness of the first layer 61a1 may be about 10 nm to about 300 nm, and the thickness of the second layer 61a2 may be about 30 nm to about 200 nm, but is not limited thereto.

For example, the first insulating layer 61a may include a first layer 61a1 and a second layer 61a2 having a different refractive index, and the second insulating layer 61b may be a monolayer which is same as (e.g., includes a common material as, is a unitary instance of material with, some combination thereof, or the like) the first layer 61a1 or the second layer 61a2.

The lower insulating layer 61 may further include a third insulating layer 61c covering the first insulating layer 61a and the second insulating layer 61b. The refractive index of the third insulating layer 61c may be different from the refractive index of the first insulating layer 61a and/or the refractive index of the second insulating layer 61b, for example, the refractive index of the third insulating layer 61c may be different from the refractive index of the first insulating layer 61a. The third insulating layer 61c may include for example silicon oxide, but is not limited thereto.

The upper insulating layer 63 may be made of an inorganic insulating material such as a silicon oxide and/or a silicon nitride, or a low dielectric constant (low K) material such as SiC, SiCOH, SiCO, and SiOF. The lower insulating layer 61 and the upper insulating layer 63 may have a trench 85 exposing the charge storage 55. The trench 85 may be filled with fillers. At least one of the lower insulating layer 61 and the upper insulating layer 63 may be omitted.

As shown in FIG. 1, the lower insulating layer 61 may include a first portion 61-1 and a second portion 61-2, where each separate portion 61-1, 61-2 corresponds to (e.g., vertically overlaps with) a separate photo-sensing device 50P, 50Q, and where the first portion 61-1 includes the third insulating layer 61c on the second insulating layer 61b and the second portion 61-2 includes the third insulating layer 61c on the first insulating layer 61a.

In some example embodiments, an image sensor 200 may exclude ("omit") the first photo-sensing device 50P, first color filter 70P, second color filter 70Q, a sub-combination thereof, or a combination thereof, such that an image sensor 200 may include photoelectric device 30, semiconductor substrate 110 stacked with the photoelectric device 30 and including a second photo-sensing device 50Q configured to sense light associated with a different ("second") wavelength spectrum from the ("first") wavelength spectrum of light selectively absorbed by the photoelectric device 30, and a first insulating layer 61a between the photoelectric device 30 and semiconductor substrate 110 that is configured to selectively reflect light of a limited portion of a wavelength spectrum of visible light, the wavelength spectrum of visible light including the different ("first and second") wavelength spectra. For example, the first insulating layer 61a may selectively reflect light associated with the first wavelength spectrum and may selectively transmit light associated with the second wavelength spectrum.

FIGS. 2, 3, 4, 5, 6, and 7 are cross-sectional views showing embodiments of the image sensor of FIG. 1, respectively.

In FIGS. 2 to 7, 'B', 'G,' and 'R' of the reference numerals may refer to blue, green, and red, respectively and 'C', 'Y,' and 'M' of the reference numerals may refer to cyan, yellow, and magenta, respectively.

Figure 2:
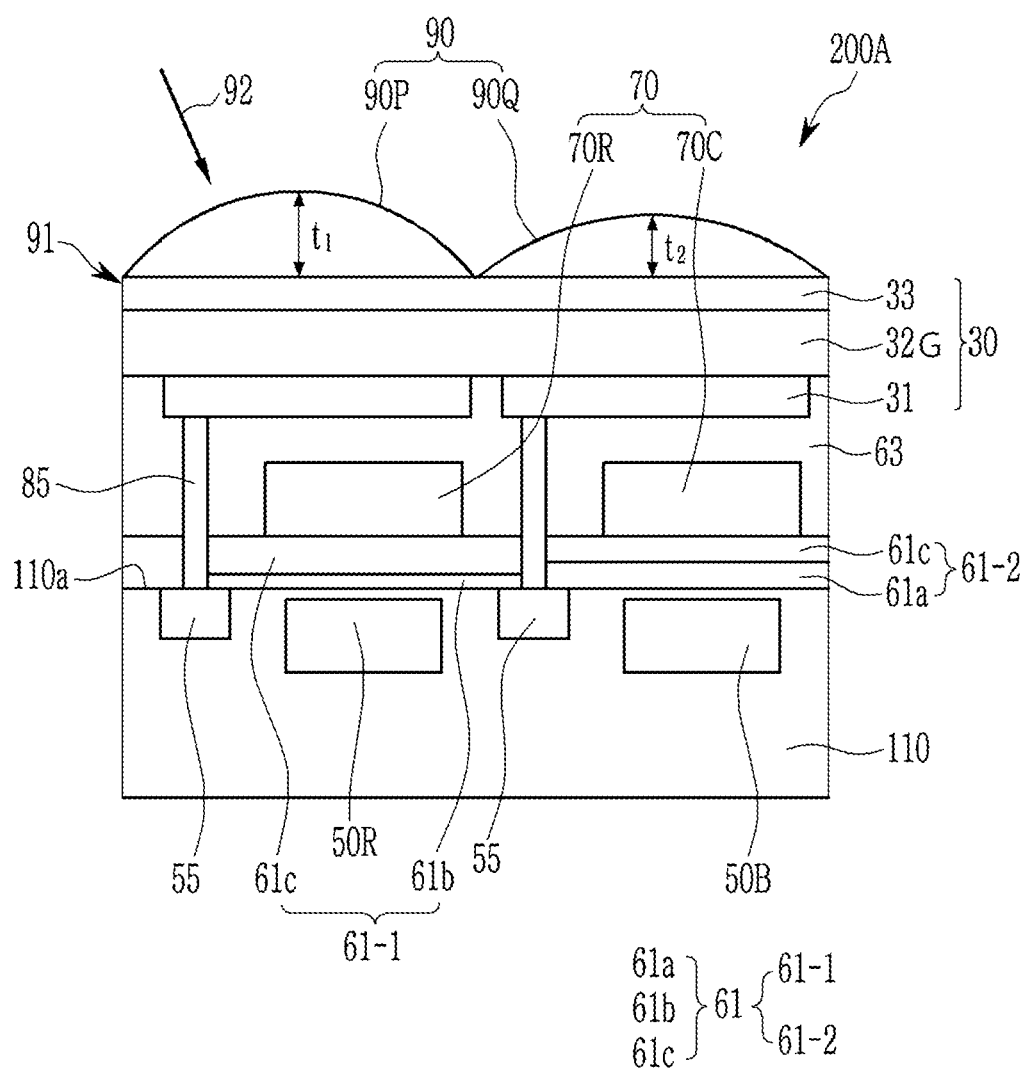
FIGS. 2, 3, 4, 5, 6, and 7 are cross-sectional views showing embodiments of the image sensor of FIG. 1 according to some example embodiments.

Referring to FIG. 2, in an image sensor 200A according to some example embodiments, the first color may be green, the second color may be red, and the third color may be blue. That is, an active layer 32G may selectively absorb light of a green wavelength spectrum, the first color filter 70P may be a red filter 70R, and the second color filter 70Q may be a cyan filter 70C transmitting light of green and blue wavelength spectra. Accordingly, the photoelectric device 30 may be a green photoelectric device, the first photo-sensing device 50P may be a red sensing device 50R, and the second photo-sensing device 50Q may be a blue sensing device 50B.

Figure 3:
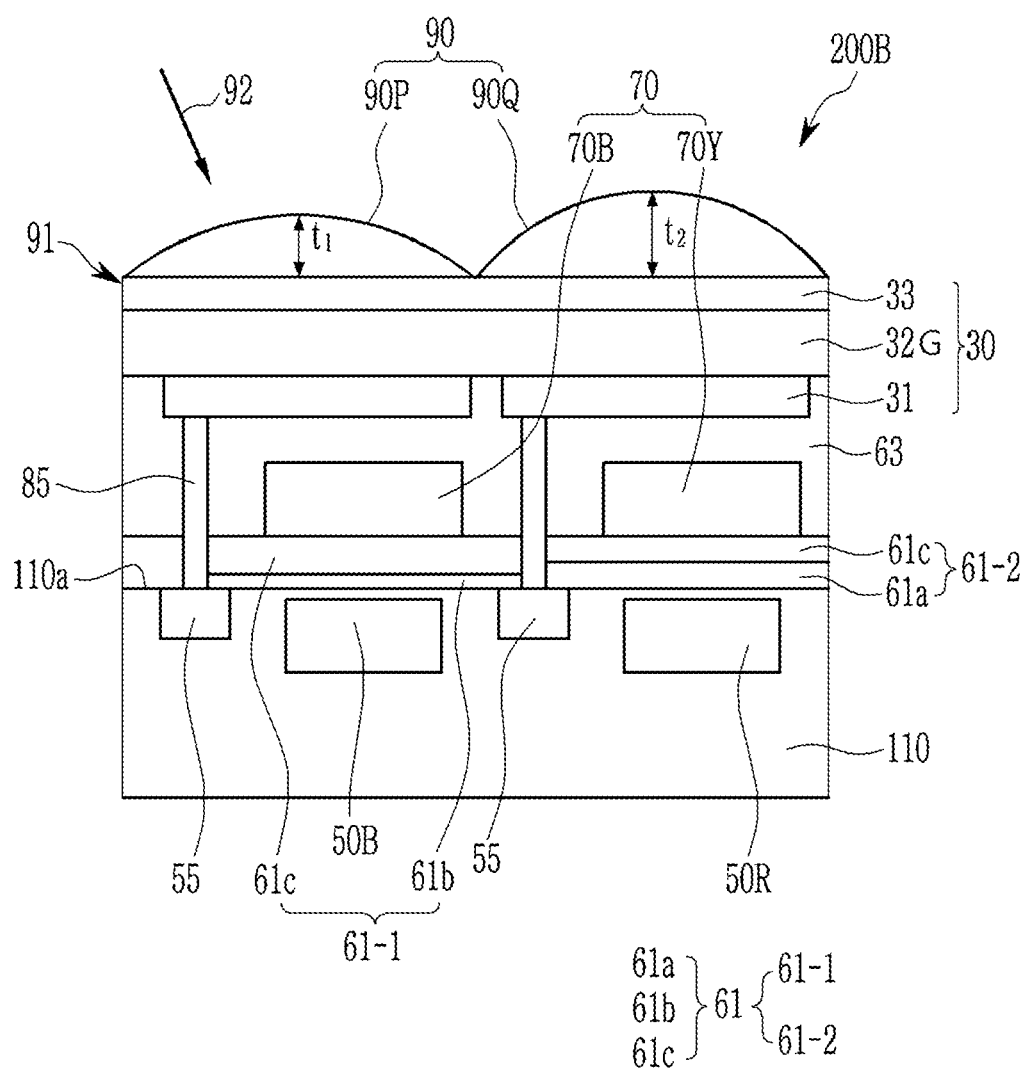

Referring to FIG. 3, in an image sensor 200B according to some example embodiments, the first color may be green, the second color may be blue, and the third color may be red. That is, an active layer 32G may selectively absorb light of a green wavelength spectrum, the first color filter 70P may be a blue filter 70B, and the second color filter 70Q may be a yellow filter 70Y transmitting light of green and red wavelength spectra. Accordingly, the photoelectric device 30 may be a green photoelectric device, the first photo-sensing device 50P may be a blue sensing device 50B, and the second photo-sensing device 50Q may be a red sensing device 50R.

Figure 4:
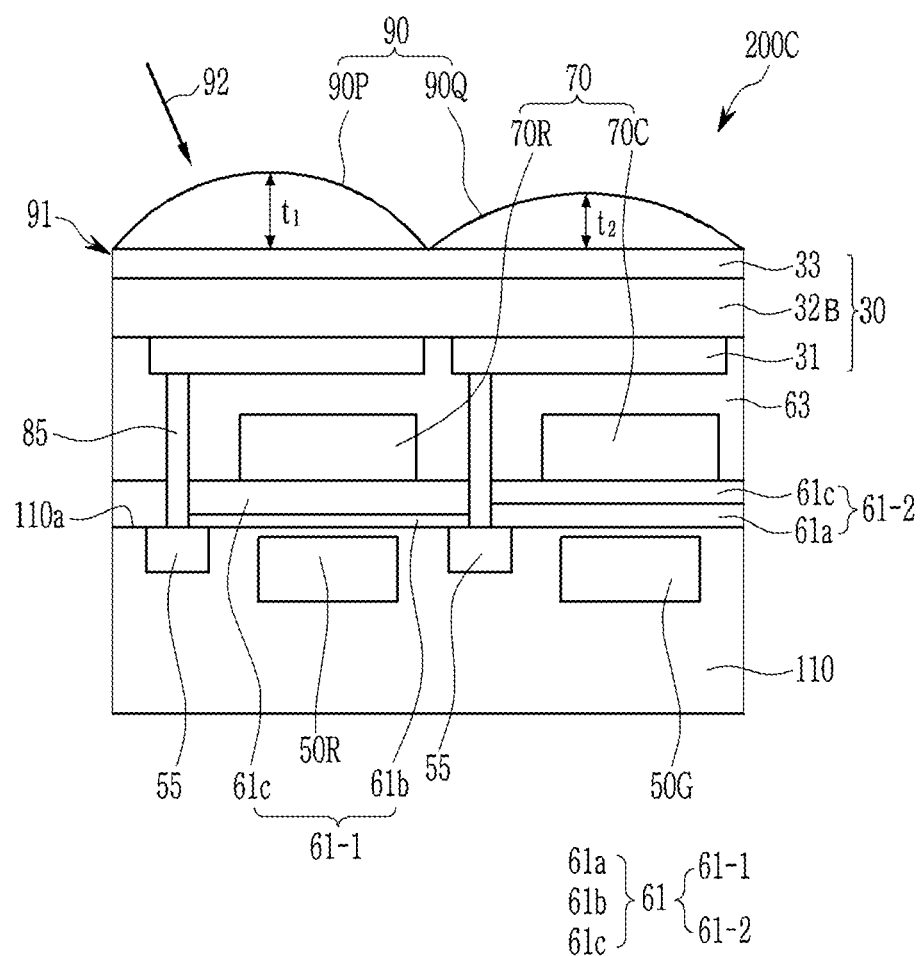

Referring to FIG. 4, in an image sensor 200C according to some example embodiments, the first color may be blue, the second color may be red, and the third color may be green. That is, an active layer 32B may selectively absorb light of a blue wavelength spectrum, the first color filter 70P may be a red filter 70R, the second color filter 70Q may be a cyan filter 70C transmitting light of blue and green wavelength spectra. Accordingly, the photoelectric device 30 may be a blue photoelectric device, the first photo-sensing device 50P may be a red sensing device 50R, and the second photo-sensing device 50Q may be a green sensing device 50G.

Figure 5:
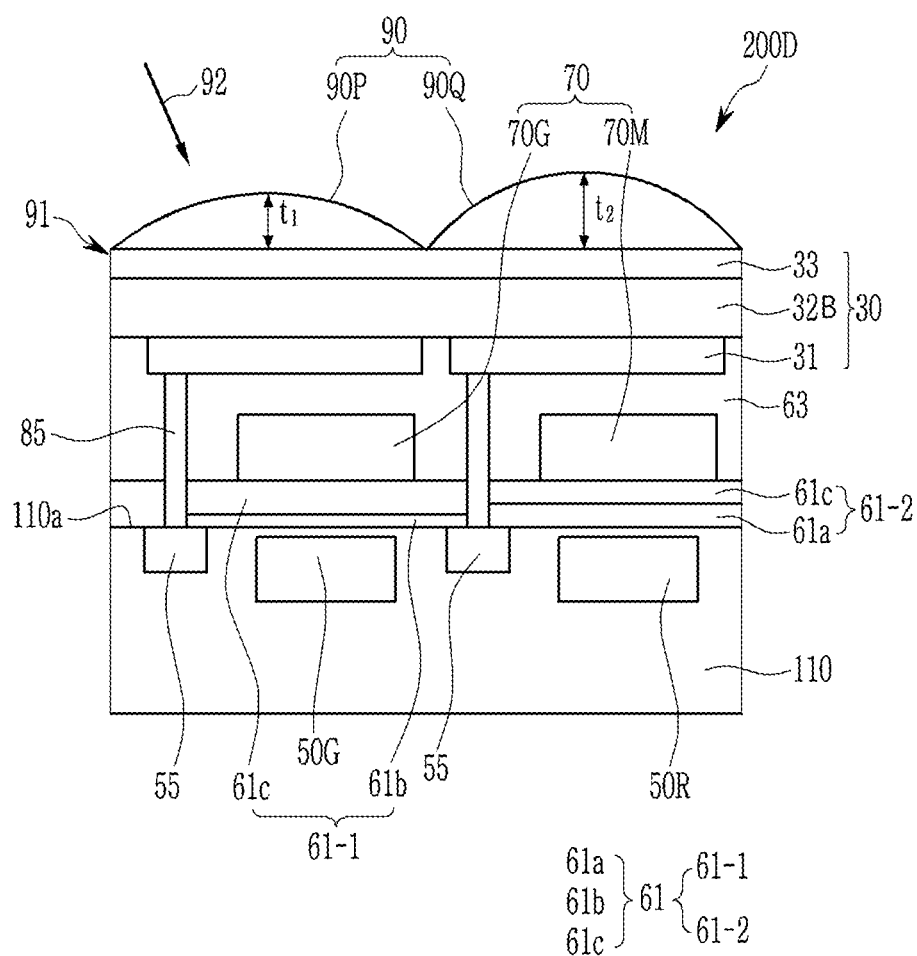

Referring to FIG. 5, in an image sensor 200D according to some example embodiments, the first color may be blue, the second color may be green, and the third color may be red. That is, an active layer 32B may selectively absorb light of a blue wavelength spectrum, the first color filter 70P may be a green filter 70G, and the second color filter 70Q may be a magenta filter 70M transmitting light of blue and red wavelength spectra. Accordingly, the photoelectric device 30 may be a blue photoelectric device, the first photo-sensing device 50P may be a green sensing device 50G and the second photo-sensing device 50Q may be a red sensing device 50R.

Figure 6:
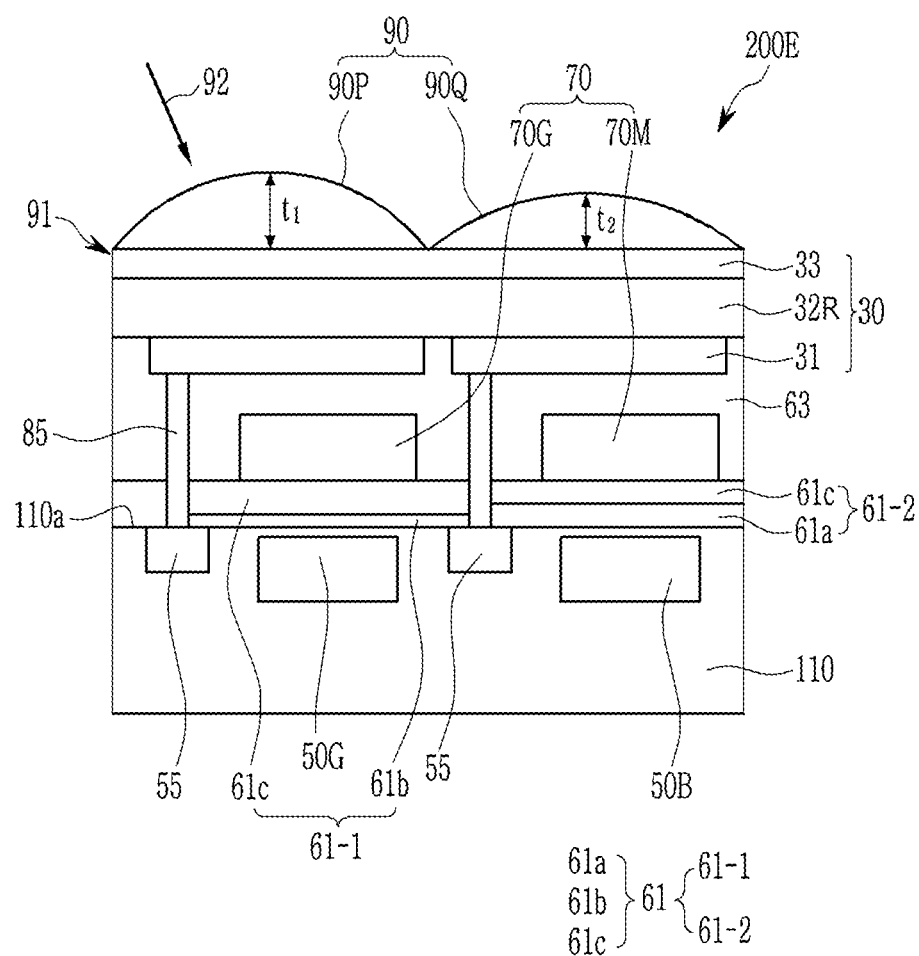

Referring to FIG. 6, in an image sensor 200E according to some example embodiments, the first color may be red, the second color may be green, and the third color may be blue. That is, an active layer 32R may selectively absorb light of a red wavelength spectrum, the first color filter 70P may be a green filter 70G, and the second color filter 70Q may be a magenta filter 70M transmitting light of red and blue wavelength spectra. Accordingly, the photoelectric device 30 may be a red photoelectric device, the first photo-sensing device 50P may be a green sensing device 50G, and the second photo-sensing device 50Q may be a blue sensing device 50B.

Figure 7:
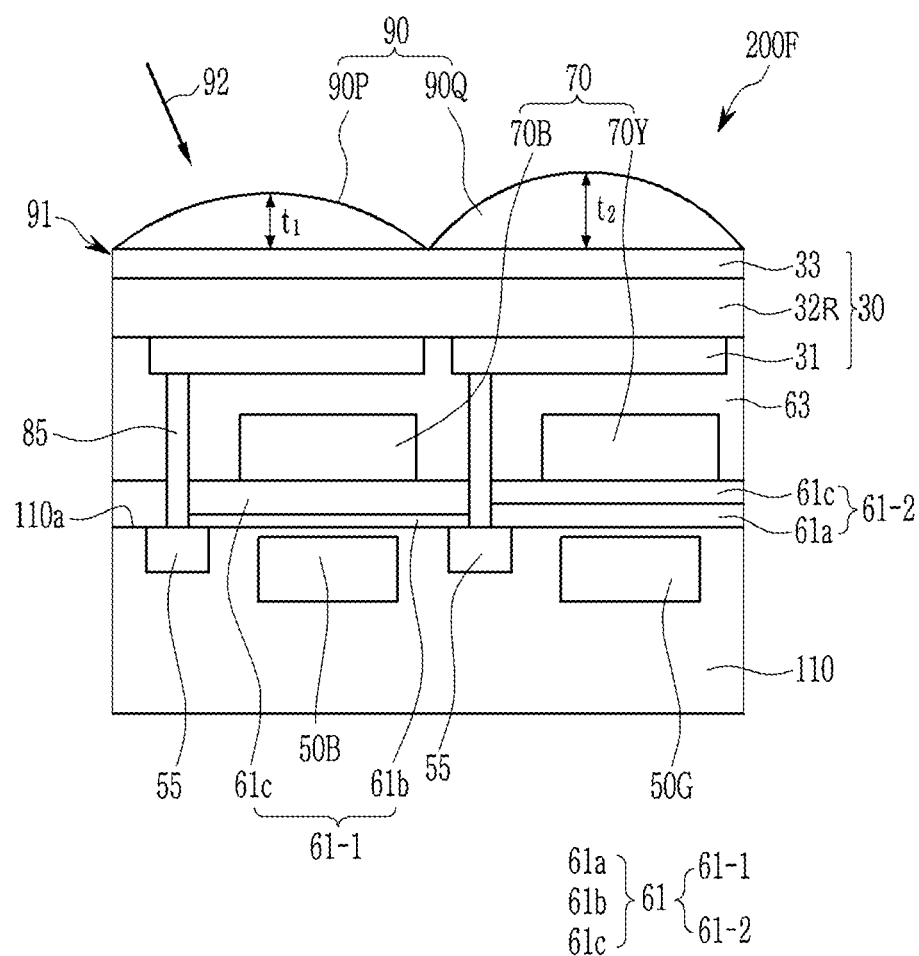

Referring to FIG. 7, in an image sensor 200F according to some example embodiments, the first color may be red, the second color may be blue, and the third color may be green. That is, an active layer 32R may selectively absorb light of a red wavelength spectrum, the first color filter 70P may be a blue filter 70B, and the second color filter 70Q may be a yellow filter 70Y transmitting light of red and green wavelength spectra. Accordingly, the photoelectric device 30 may be a red photoelectric device, the first photo-sensing device 50P may be a blue sensing device 50B, and the second photo-sensing device 50Q may be a green sensing device 50G.

The image sensor may further include a focusing lens 90. The focusing lens 90 may control a direction of incident light 92 and gather the light in one region. The focusing lens 90 may have a shape of, for example, a cylinder or a hemisphere, but is not limited thereto. As shown in at least FIGS. 1-7, the focusing lens 90 may be on the photoelectric device 30.

For example, as shown in at least FIG. 1, the focusing lens 90 may be disposed in each pixel, and for example the focusing lens 90 may include a first focusing lens 90P disposed on the upper surface of the first photo-sensing device 50P and a second focusing lens 90Q disposed on the upper surface of the second photo-sensing device 50Q.

Herein, the first focusing lens 90P and the second focusing lens 90Q may have different shapes and/or thicknesses. As shown in at least FIG. 2, the thickness $t_1$ of the first focusing lens 90P may be greater than the thickness $t_2$ of the second focusing lens 90Q. As shown in at least FIG. 3, the thickness $t_1$ of the first focusing lens 90P may be smaller than the thickness $t_2$ of the second focusing lens 90Q. The shapes and/or thicknesses of the first focusing lens 90P and the second focusing lens 90Q may be different according to wavelength spectra sensed in the first photo-sensing device 50P and the second photo-sensing device 50Q. For example, a first focusing lens 90P of a pixel including a first photo-sensing device 50P sensing light of a wavelength spectrum in a long wavelength region may be thicker than a second focusing lens 90Q of a pixel including a second photo-sensing device 50Q sensing light of a wavelength spectrum in a short wavelength region (e.g., where the second wavelength spectrum is a longer wavelength region than the third wavelength spectrum). For example when a blue photo-sensing device and a red photo-sensing device is repetitively arranged along with a row and a column, a focusing lens 90 of a pixel including the red photo-sensing device may have a larger thickness than a focusing lens 90 of a pixel including the blue photo-sensing device, but is not limited thereto. In another example, a second focusing lens 90Q of a pixel including a second photo-sensing device 50Q sensing light of a wavelength spectrum in a long wavelength region may be thicker than a first focusing lens 90P of a pixel including a first photo-sensing device 50P sensing light of a wavelength spectrum in a short wavelength region (e.g., where the third wavelength spectrum is a longer wavelength region than the second wavelength spectrum).

An image sensor according to some example embodiments has a structure that the photo-sensing device and the photoelectric device are stacked and thus may have a reduced area and be down-sized. In addition, the image sensor according to some example embodiments may decrease a light loss by the color filter and increase sensitivity by including a color filter transmitting mixed light. In addition, the image sensor according to some example embodiments may compensate the drawback of the color filter transmitting mixed light and realize a high sensitive image sensor having improved color separation characteristics, by including an insulating layer selectively reflecting light of a predetermined wavelength spectrum according to a wavelength spectrum of a main color sensed by the first photo-sensing device or the second photo-sensing device.

The image sensor may be respectively applied to various electronic devices, which include, for example, a camera, a camcorder, and a mobile phone internally having them, a display device, a security system, a medical device, or the like is not limited thereto.

Figure 8:
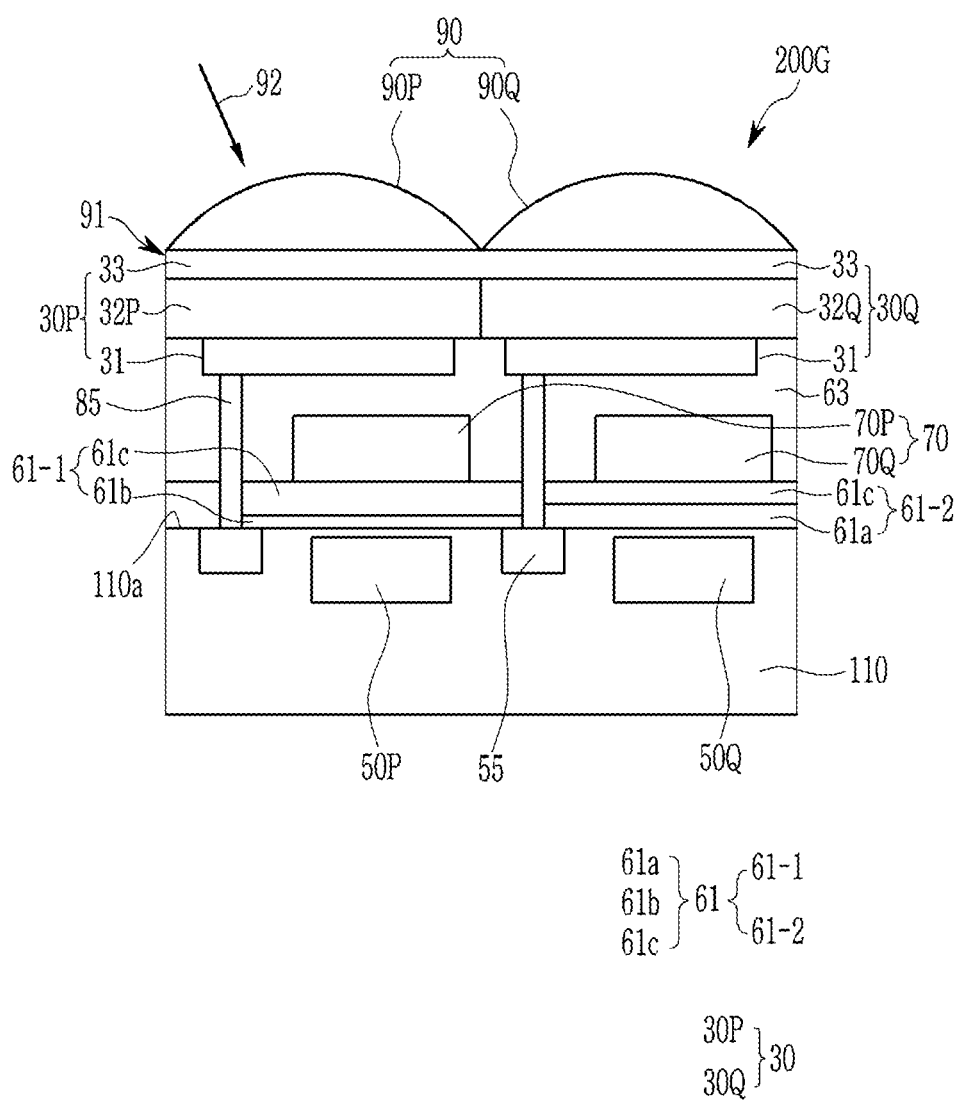
FIG. 8 is a schematic cross-sectional view showing an image sensor according to some example embodiments.

FIG. 8 is a schematic cross-sectional view showing an image sensor according to some example embodiments.

As shown with reference to FIG. 8, an image sensor 200G may include a plurality of photoelectric devices 30P, 30Q on a semiconductor substrate 110, where the plurality of photoelectric devices 30P, 30Q are configured to convert light associated with different wavelength spectra (e.g., different colors of blue light, green light, or red light) into electric signals, respectively. As shown, the first photoelectric device 30P includes a first active layer 32P and the second photoelectric device 30Q includes a second active layer 32Q that is different from the first active layer 32P, such that the first and second photoelectric devices 30P, 30Q are configured to selectively absorb light associated with different wavelength spectra (e.g., different colors). As further shown, the first and second photoelectric devices 30P, 30Q may be at a common distance from the semiconductor substrate 110, such that the first and second photoelectric devices 30P, 30Q collectively establish a photoelectric device 30 having a flush or substantially flush (e.g., flush within manufacturing tolerances and/or material tolerances) upper surface, as shown in at least FIG. 8.

The first photoelectric device 30P may be configured to selectively absorb light associated with a first color and the second photoelectric device 30Q may be configured to selectively absorb light associated with a second color, while the first photo-sensing device 50P may be configured to sense light associated with a third color and the second photo-sensing device 50Q may be configured to sense light associated with a fourth color.

In some example embodiments, the second photo-sensing device 50Q may be omitted from the image sensor 200G, and the second photoelectric device 30Q may be configured to selectively absorb light in a non-visible wavelength spectrum, including near infra-red light, far infra-red light, ultra-violet light, a sub-combination thereof, or a combination thereof. For example, the second photoelectric device 30Q may selectively absorb light in ("associated with") an infra-red wavelength spectrum of greater than or equal to about 700 nm and less than or equal to about 1300 nm without absorption.

Figure 9:
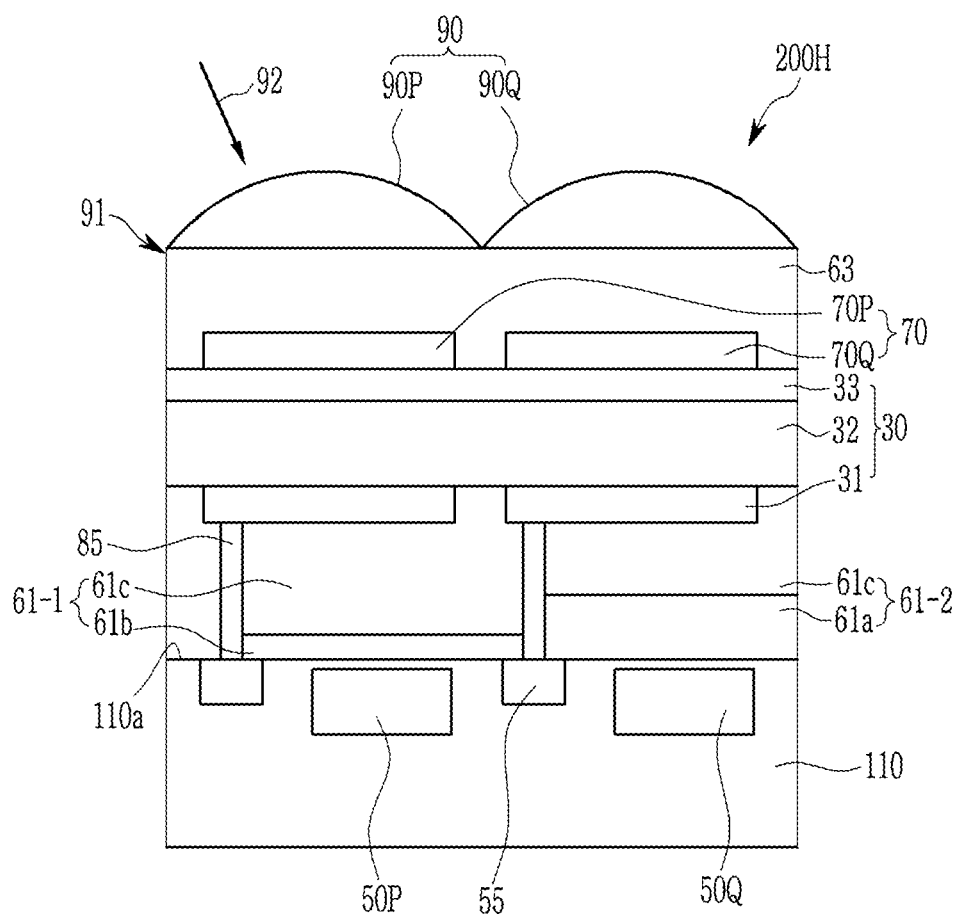
FIG. 9 is a schematic cross-sectional view showing an image sensor according to some example embodiments.

FIG. 9 is a schematic cross-sectional view showing an image sensor according to some example embodiments.

Referring to FIG. 9, in some example embodiments, an image sensor 200H may include the color filter layer 70 and the upper insulating layer 63 as being distal from the semiconductor substrate 110 in relation to the photoelectric device 30, such that the photoelectric device 30 is between the first and second color filters 70P, 70Q and the semiconductor substrate 110. In some example embodiments, each color filter 70P, 70Q may selectively transmit mixed light that includes both light associated with the first color (which the photoelectric device 30 is configured to selectively absorb) and light associated with the respective photo-sensing device 50P, 50Q over which the respective color filter 70P, 70Q is vertically overlapping. For example, in FIG. 9, the photoelectric device 30 may selectively absorb green light, the first and second photo-sensing devices 50P, 50Q may sense red light and blue light, respectively, and the first and second color filter layers 70P, 70Q may selectively transmit yellow light and cyan light, respectively.

In some example embodiments, an image sensor may include multiple photoelectric devices that are vertically stacked on each other (e.g., stacked in a vertical direction), where the multiple photoelectric devices may selectively absorb light associated with different wavelength spectra. For example, image sensor 200 as shown in FIG. 1 may include an additional photoelectric device that may selectively absorb light associated with an infra-red wavelength spectrum, where the additional photoelectric device is stacked on the photoelectric device 30, such that the additional photoelectric device is either between photoelectric device 30 and the semiconductor substrate 110 (e.g., is directly between the photoelectric device 30 and the upper insulating layer 63) or is distal to the semiconductor substrate 110 in relation to the photoelectric device 30 (e.g., is directly between the photoelectric device 30 and the focusing lens 90). In some example embodiments, image sensor 200 may include a photoelectric device 30 and no additional photoelectric device, where the photoelectric device is configured to selectively absorb light associated with a first wavelength spectrum that is an infra-red wavelength spectrum (e.g., infra-red light).

Figure 10:
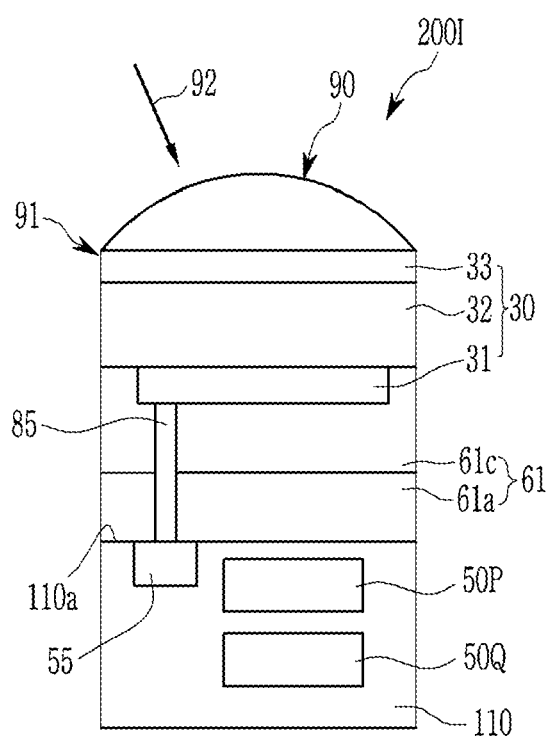
FIG. 10 is a schematic cross-sectional view of an image sensor according to some example embodiments.

FIG. 10 is a schematic cross-sectional view of an image sensor according to some example embodiments.

In the image sensor 200I of FIG. 10, the first photo-sensing device 50Q (and the second photo-sensing device 50Q are stacked, within the semiconductor substrate 110, orthogonally in relation to the upper surface 110a of the semiconductor substrate 110, such that the first photo-sensing device 50P is proximate to the upper surface 110a of the semiconductor substrate 110 in relation to the second photo-sensing device 50Q. In some example embodiments, the first photo-sensing device 50Q may sense light associated with a shorter wavelength spectrum than the second photo-sensing device 50P, based on the first photo-sensing device 50P being proximate to the upper surface 110a of the semiconductor substrate 110, and thus proximate to the light incident side of the image sensor 200I, in relation to the second photo-sensing device 50Q. For example, where the photoelectric device 30 is configured to selectively absorb green light, the first photo-sensing device 50P may sense blue light and the second photo-sensing device 50Q may sense red light.

Figure 11:
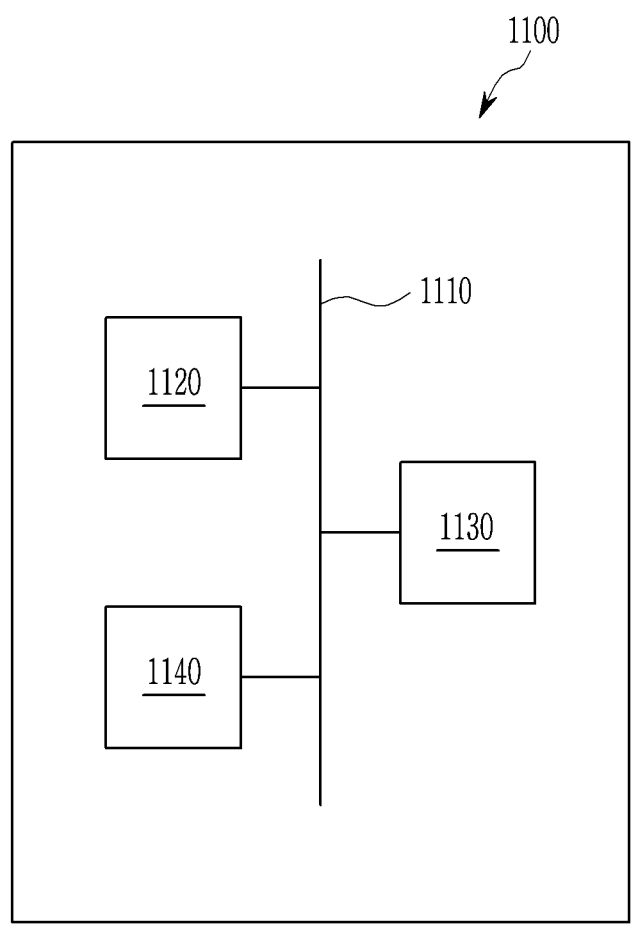
FIG. 11 is a schematic diagram of an electronic device 1100 according to some example embodiments.

FIG. 11 is a schematic diagram of an electronic device 1100 according to some example embodiments.

As shown in FIG. 11, an electronic device 1100 may include a processor 1120, a memory 1130, and an image sensor 1140 that are electrically coupled together via a bus 1110. The image sensor 1140 may be an image sensor of any of the example embodiments as described herein. The memory 1130, which may be a non-transitory computer readable medium, may store a program of instructions. The processor 1120 may execute the stored program of instructions to perform one or more functions. For example, the processor 1120 may be configured to process electric signals generated by the image sensor 1140. The processor 1120 may be configured to generate an output (e.g., an image to be displayed on a display interface) based on processing the electric signals.

While this disclosure has been described in connection with what is presently considered to be practical example embodiments, it is to be understood that the inventive concepts are not limited to the disclosed example embodiments, but, on the contrary, is intended to cover various modifications and equivalent arrangements included within the spirit and scope of the appended claims.

What is claimed is:

1. A image sensor, comprising:
   a photoelectric device, the photoelectric device including
      a first electrode and a second electrode facing each other, and an active layer between the first electrode and the second electrode and configured to selectively absorb light associated with a first wavelength spectrum, the first wavelength spectrum associated with a first color of three primary colors;
   a semiconductor substrate stacked with the photoelectric device, the semiconductor substrate including
      a first photo-sensing device configured to sense light associated with a second wavelength spectrum, the second wavelength spectrum associated with a second color of the three primary colors, and
      a second photo-sensing device configured to sense light associated with a third wavelength spectrum, the third wavelength spectrum associated with a third color of the three primary colors,
   a first color filter corresponding to the first photo-sensing device, the first color filter configured to selectively transmit light associated with the second wavelength spectrum;
   a second color filter corresponding to the second photo-sensing device, the second color filter configured to selectively transmit light associated with a mixed wavelength spectrum, the mixed wavelength spectrum associated with a mixed color of the first color and the third color; and
   a first insulating layer between the photoelectric device and the semiconductor substrate, the first insulating layer corresponding to the second photo-sensing device, the first insulating layer configured to selectively reflect light of a limited portion of a wavelength spectrum of visible light, the wavelength spectrum of visible light including the first wavelength spectrum, the second wavelength spectrum, and the third wavelength spectrum, and
   a focusing lens on the photoelectric device, the focusing lens including
      a first focusing lens on the first photo-sensing device,
      a second focusing lens on the second photo-sensing device,
   wherein a thickness of the first focusing lens is different from a thickness of the second focusing lens,
   wherein,
      the second wavelength spectrum is a longer wavelength region than the third wavelength spectrum, and the thickness of the first focusing lens is greater than the thickness of the second focusing lens, or
      the third wavelength spectrum is a longer wavelength region than the second wavelength spectrum, and the thickness of the second focusing lens is greater than the thickness of the first focusing lens.

2. The image sensor of claim 1, wherein the first insulating layer is configured to selectively reflect light associated with the first wavelength spectrum or the second wavelength spectrum.

3. The image sensor of claim 1, wherein the first insulating layer includes a first layer and a second layer, the first layer associated with a first refractive index, the second layer associated with a second refractive index, the second refractive index different from the first refractive index.

4. The image sensor of claim 3, wherein a difference between the first refractive index and the second refractive index is equal to or greater than about 0.2.

5. The image sensor of claim 3, wherein
   the first refractive index ranges from about 1.2 to about 1.8, and
   the second refractive index ranges from about 2.0 to about 3.0.

6. The image sensor of claim 1, further comprising:
   a second insulating layer between the photoelectric device and the semiconductor substrate, the second insulating layer corresponding to the first photo-sensing device,
   wherein the second insulating layer is different from the first insulating layer.

7. The image sensor of claim 6, wherein a refractive index of the first insulating layer is different from a refractive index of the second insulating layer.

8. The image sensor of claim 6, wherein a thickness of the first insulating layer is different from a thickness of the second insulating layer.

9. The image sensor of claim 8, wherein the thickness of the first insulating layer is greater than the thickness of the second insulating layer.

10. The image sensor of claim 6, wherein
    the first insulating layer includes a first layer and a second layer, the first layer associated with a first refractive index, the second layer associated with a second refractive index, the second refractive index different from the first refractive index, and the second insulating layer includes a common material as the first layer or the second layer.

11. The image sensor of claim 6, further comprising:
a third insulating layer on the first insulating layer and the second insulating layer,
wherein a refractive index of the third insulating layer is different from a refractive index of the first insulating layer.

12. The image sensor of claim 11, wherein the third insulating layer includes silicon oxide.

13. The image sensor of claim 1, wherein
the first color is green,
the first color filter is a blue filter or a red filter, and
the second color filter is a yellow filter or a cyan filter.

14. The image sensor of claim 1, wherein
the first color is red,
the first color filter is a blue filter or a green filter, and
the second color filter is a yellow filter or a magenta filter.

15. The image sensor of claim 1, wherein
the first color is blue,
the first color filter is a green filter or a red filter, and
the second color filter is a magenta filter or a cyan filter.

16. The image sensor of claim 1, wherein each color filter of the first color filter and the second color filter is between the photoelectric device and the semiconductor substrate.

17. An electronic device comprising the image sensor of claim 1.

18. An image sensor, comprising:
a photoelectric device, the photoelectric device including a first electrode and a second electrode facing each other, and an active layer between the first electrode and the second electrode and configured to selectively absorb light associated with a first wavelength spectrum;
a semiconductor substrate stacked with the photoelectric device, the semiconductor substrate including a first photo-sensing device configured to sense light associated with a second wavelength spectrum and a second photo-sensing device configured to sense light associated with a third wavelength spectrum;
a first insulating layer between the photoelectric device and the semiconductor substrate, the first insulating layer corresponding to the first photo-sensing device, the first insulating layer configured to selectively reflect light of a limited portion of a wavelength spectrum of visible light, the wavelength spectrum of visible light including the first wavelength spectrum and the second wavelength spectrum;
a second insulating layer between the photoelectric device and the semiconductor substrate, the second insulating layer corresponding to the first photo-sensing device, the second insulating layer being different from the first insulating layer;
a third insulating layer on the first insulating layer and the second insulating layer, the third insulating layer under the photoelectric device, a refractive index of the third insulating layer being different from a refractive index of the first insulating layer; and a focusing lens on the photoelectric device, the focusing lens including
a first focusing lens on the first photo-sensing device, and
a second focusing lens on the second photo-sensing device,
wherein a thickness of the first focusing lens is different from a thickness of the second focusing lens,
wherein,
the second wavelength spectrum is a longer wavelength region than the third wavelength spectrum, and the thickness of the first focusing lens is greater than the thickness of the second focusing lens, or
the third wavelength spectrum is a longer wavelength region than the second wavelength spectrum, and the thickness of the second focusing lens is greater than the thickness of the first focusing lens.

19. The image sensor of claim 18, wherein the first insulating layer is configured to selectively reflect light associated with the first wavelength spectrum.

20. The image sensor of claim 18, wherein the first insulating layer includes a first layer and a second layer, the first layer associated with a first refractive index, the second layer associated with a second refractive index, the second refractive index different from the first refractive index.

21. The image sensor of claim 20, wherein a difference between the first refractive index and the second refractive index is equal to or greater than about 0.2.

22. The image sensor of claim 18, further comprising:
a first color filter corresponding to the first photo-sensing device, the first color filter configured to selectively transmit at least light associated with the second wavelength spectrum.

23. The image sensor of claim 22, wherein the first color filter is between the photoelectric device and the semiconductor substrate.

24. The image sensor of claim 22, wherein the photoelectric device is between the first color filter and the semiconductor substrate.

25. The image sensor of claim 18, wherein the photoelectric device includes
a first photoelectric device corresponding to the first photo-sensing device, and
a second photoelectric device corresponding to the second photo-sensing device, the first and second photoelectric devices configured to selectively absorb light associated with different wavelength spectra.

26. The image sensor of claim 18, wherein the first and second photo-sensing devices are stacked orthogonally in the semiconductor substrate such that the first photo-sensing device is proximate to an upper surface of the semiconductor substrate in relation to the second photo-sensing device.

27. The image sensor of claim 18, wherein the first wavelength spectrum is an infra-red wavelength spectrum.

* * * * *